United States Patent
Tan et al.

(10) Patent No.: US 9,099,970 B2
(45) Date of Patent: Aug. 4, 2015

(54) CLASS AB DIFFERENTIAL LINE DRIVERS

(71) Applicant: Broadcom Corporation, Irvine, CA (US)

(72) Inventors: Junhua Tan, Tustin, CA (US); Hui Pan, Trabuco Canyon, CA (US); Karim Vincent Abdelhalim, Newport Beach, CA (US); Mostafa Mohammad Hany Ali Hammad, Irvine, CA (US); Yuan Yao, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 64 days.

(21) Appl. No.: 13/909,387

(22) Filed: Jun. 4, 2013

(65) Prior Publication Data

US 2014/0333380 A1     Nov. 13, 2014

Related U.S. Application Data

(60) Provisional application No. 61/820,785, filed on May 8, 2013.

(51) Int. Cl.
*H03F 3/45*     (2006.01)

(52) U.S. Cl.
CPC ........ *H03F 3/45183* (2013.01); *H03F 3/45941* (2013.01); *H03F 3/45959* (2013.01); *H03F 2203/45466* (2013.01); *H03F 2203/45641* (2013.01); *H03F 2203/45642* (2013.01)

(58) Field of Classification Search
USPC .......................................... 330/258, 302, 310
IPC ........................................................... H03F 3/45
See application file for complete search history.

(56) References Cited

U.S. PATENT DOCUMENTS

| | | | | |
|---|---|---|---|---|
| 5,166,635 | A * | 11/1992 | Shih ............................. | 330/253 |
| 5,319,316 | A * | 6/1994 | Fensch ......................... | 330/253 |
| 5,381,112 | A * | 1/1995 | Rybicki et al. ................ | 330/253 |
| 6,377,122 | B1 * | 4/2002 | Rokhsaz ....................... | 330/253 |
| 6,760,381 | B2 * | 7/2004 | Lu ................................. | 375/257 |
| 7,071,780 | B2 * | 7/2006 | Van Zanten ................... | 330/258 |
| 7,200,176 | B1 * | 4/2007 | Paulos et al. ................. | 375/257 |
| 8,598,906 | B2 * | 12/2013 | van der Goes et al. ....... | 326/37 |

* cited by examiner

*Primary Examiner* — Patricia T Nguyen
(74) *Attorney, Agent, or Firm* — Oblon, McClelland, Maier & Neustadt, L.L.P.

(57) ABSTRACT

An output stage of a differential line driver generates a differential output signal. A common-mode component of the differential output signal is decoupled from the differential output signal using a common-mode voltage sense. The common-mode component of the differential output signal is provided to a capacitor that is coupled between the output stage and the common-mode voltage sense.

20 Claims, 11 Drawing Sheets

CLASS AB DIFFERENTIAL LINE DRIVERS

CROSS-REFERENCE TO RELATED APPLICATIONS

This application claims priority to co-pending U.S. Provisional Application Ser. No. 61/820,785, filed May 8, 2013, which is hereby incorporated by reference herein in its entirety.

BACKGROUND

A communication device may communicate with one or more other devices through a conductive line. The communication device may use a line driver in order to generate amplified signals that are able to travel across various distances and overcome noise present in the conductive line.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

Figure 1:
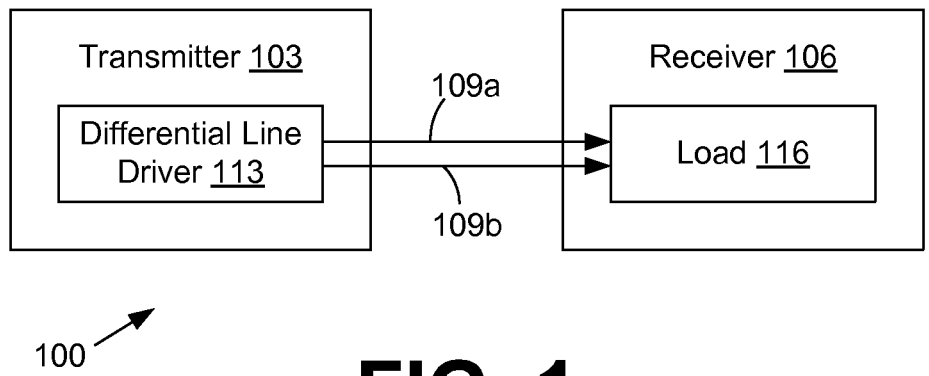
FIG. 1 is a drawing of an example of a communication environment according to various embodiments of the present disclosure.

The present disclosure is directed towards class AB differential line drivers. With reference to FIG. 1, shown is an example of a communication environment 100 according to various embodiments of the present disclosure. The communication environment 100 in the embodiment shown in FIG. 1 includes a transmitter 103 in communication with a receiver 106 via a first line 109a and a second line 109b. The first line 109a may be, for example, one or more wires, cables, or any other type of medium that is capable of conducting electrical signals between the transmitter 103 and the receiver 106. Similarly, the second line 109b may be one or more wires, cables, or any other type of medium that is capable of conducting electrical signals between the transmitter 103 and the receiver 106. The first line 109a and the second line 109b together may be regarded as being a differential pair.

The transmitter 103 is a communication device that is capable of transmitting signals to another device using the first line 109a and the second line 109b, and the receiver 106 is a communication device that is capable of receiving signals from another device using the first line 109a and the second line 109b. The transmitter 103 may be embodied in the form of, for example, a network interface card (NIC), a network switch, or any other type of device that transmits data. Similarly, the receiver 106 may be embodied in the form of, for example, a NIC, a network switch, or any other type of device that receives data.

The transmitter 103 includes a differential line driver 113 and other components that are not discussed in detail herein for the purposes of brevity. The differential line driver 113 receives input data signals in the transmitter 103 and amplifies the signals for transmission over the first line 109a and the second line 109b to the receiver 106. By amplifying the signals being transmitted over the first line 109a and the second line 109b, it may be more likely that the data will be received by the receiver 106 and be of a quality that is satisfactory for use by the receiver 106.

The differential line driver 113 is configured to transmit data over the first line 109a and the second line 109b using differential signaling techniques. In this regard, the differential line driver 113 transmits data over the first line 109a and the second line 109b by outputting a first signal on the first line 109a and a complementary second signal on the second line 109b. By using differential signaling techniques, the data transmitted over the first line 109a and the second line 109b may be less susceptible to degradation from noise or interference that may be present in the communication environment 100.

The receiver 106 comprises a load 116 and other components that are not discussed in detail herein for the purposes of brevity. The load 116 represents circuitry that receives the signals transmitted over the first line 109a and the second line 109b. Because the transmitted signals are differential signals, the receiver 106 can transform the received differential signals into a form that is compatible for processing by various components in the receiver 106.

Figure 2A:
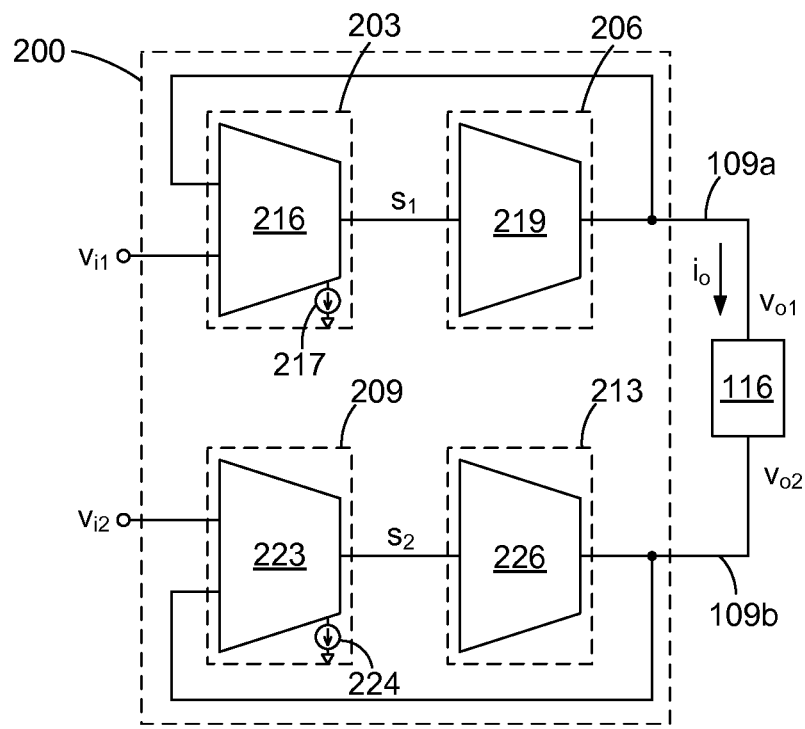
FIGS. 2A-2C are schematic diagrams representing a first example of a differential line driver employed in the communication environment of FIG. 1 according to various embodiments of the present disclosure.

With reference to FIG. 2A, shown is a schematic diagram representing a first example of the differential line driver 113 (FIG. 1), referred to herein as the first differential line driver 200, according to various embodiments of the present disclosure. The first differential line driver 200 is shown coupled to the load 116 of the receiver 106 (FIG. 1) via the first line 109a and the second line 109b.

The first differential line driver 200 receives a first differential input signal $v_{i1}$ and a second differential input signal $v_{i2}$ as input signals. The first differential input signal $v_{i1}$ and the second differential input signal $v_{i2}$ represent the data that is to be transmitted from the transmitter 103 to the receiver 106. The first differential input signal $v_{i1}$ and the second differential input signal $v_{i2}$ may be generated and provided by other circuitry (not shown) in the transmitter 103 (FIG. 1).

The first differential line driver 200 generates a first differential output signal $v_{o1}$ and a second differential output signal $v_{o2}$ as outputs. The first differential output signal $v_{o1}$ is transmitted to the load 116 via the first line 109a, and the second differential output signal $v_{o2}$ is transmitted to the load 116 via the second line 109b. Additionally, an output current $i_o$ is associated with the first differential output signal $v_{o1}$ and the second differential output signal $v_{o2}$.

The first differential line driver 200 comprises a first input stage 203, a first output stage 206, a second input stage 209, a second output stage 213, and potentially other components. The first output stage 206 and the second output stage 213 together may be regarded as being a class AB output stage.

The input of the first input stage 203 in the embodiment shown in FIG. 2A is coupled to the output of the first output stage 206 and to the circuitry in the transmitter 103 (FIG. 1) that provides the first differential input signal $v_{i1}$. In alternative embodiments, the first differential input signal $v_{i1}$ may be processed by a buffer, a filter, an amplification stage, and/or any other type of component in the first differential line driver 200 prior to the first input stage 203 receiving the first differential input signal $v_{i1}$. The output of the first input stage 203 is coupled to the input of the first output stage 206.

The first input stage 203 in the embodiment shown in FIG. 2A comprises a first transconductance stage 216. The first transconductance stage 216 receives the first differential input signal $v_{i1}$ and the first differential output signal $v_{o1}$ as inputs and generates a signal $s_1$ comprising a current that is responsive to the voltages of the first differential input signal $v_{i1}$ and the first differential output signal $v_{o1}$. The signal $s_1$ is provided to the input of the first output stage 206. The first input stage 203 also comprises a first fixed bias current 217 that is associated with the first transconductance stage 216. Due to the configuration of the first differential line driver 200, the transconductance for the first transconductance stage 216 may be relatively constant across the operating range of the first differential line driver 200.

The input of the first output stage 206 in the embodiment shown in FIG. 2A is coupled to the output of the first input stage 203. The output of the first output stage 206 is coupled to the input of the first input stage 203 and the load 116. In alternative embodiments, the output of the first output stage 206 may be coupled to a buffer, a filter, an amplification stage, and/or any other type of component in the first differential line driver 200 such that the first differential output signal $v_{o1}$ is processed by such a component prior to the first differential output signal $v_{o1}$ being received by the load 116 and/or the first input stage 203.

The first output stage 206 in the embodiment shown in FIG. 2A comprises a second transconductance stage 219. The second transconductance stage 219 receives the signal $s_1$ from the first input stage 203 as an input and generates the first differential output signal $v_{o1}$ responsive to the voltage of the signal $s_1$. Due to the configuration of the first differential line driver 200, the transconductance for the second transconductance stage 219 may be proportional to the value of the output current $i_o$ from the first differential line driver 200. For example, the transconductance for the second transconductance stage 219 may increase as the output current $i_o$ from the first differential line driver 200 increases. As a result, the unity gain bandwidth of the first differential line driver 200 may vary as a function of the output current $i_o$.

The input of the second input stage 209 in the embodiment shown in FIG. 2A is coupled to the output of the second output stage 213 and to the circuitry in the transmitter 103 that provides the second differential input signal $v_{i2}$. In alternative embodiments, the second differential input signal $v_{i2}$ may be processed by a buffer, a filter, an amplification stage, and/or any other type of component in the first differential line driver 200 prior to the second differential input signal $v_{i2}$ being received by the second input stage 209. The output of the second input stage 209 is coupled to the input of the second output stage 213.

The second input stage 209 in the embodiment shown in FIG. 2A comprises a third transconductance stage 223. The third transconductance stage 223 receives the second differential input signal $v_{i2}$ and the second differential output signal $v_{o2}$ as inputs and generates a signal $s_2$ comprising a current that is responsive to the voltages of the second differential input signal $v_{i2}$ and the second differential output signal $v_{o2}$. The signal $s_2$ is provided to the input of the second output stage 213. The second input stage 209 also comprises a second fixed bias current 224 that is associated with the third transconductance stage 223. Due to the configuration of the first differential line driver 200, the transconductance for the third transconductance stage 223 may be relatively constant across the operating range of the first differential line driver 200.

The input of the second output stage 213 in the embodiment shown in FIG. 2A is coupled to the output of the second input stage 209. The output of the second output stage 213 is coupled to the input of the second input stage 209 and the load 116. In alternative embodiments, the output of the second output stage 213 may be coupled to a buffer, a filter, an amplification stage, and/or any other type of component in the first differential line driver 200 such that the second differential output signal $v_{o2}$ is processed by such a component prior to the second differential output signal $v_{o2}$ being received by the load 116 and/or the second input stage 209.

The second output stage 213 in the embodiment shown in FIG. 2A comprises a fourth transconductance stage 226. The fourth transconductance stage 226 receives the signal $s_2$ from the second input stage 209 as an input and generates the second differential output signal $v_{o2}$ responsive to the voltage of the signal $s_2$. Due to the configuration of first differential line driver 200, the transconductance for the fourth transconductance stage 226 is proportional to the value of the output current $i_o$ from the first differential line driver 200. For example, the transconductance for the fourth transconductance stage 226 may increase as the output current $i_o$ from the first differential line driver 200 increases. As a result, the unity gain bandwidth of the first differential line driver 200 may vary as a function of the output current $i_o$.

The transfer function of the first differential line driver 200 has two poles. The first pole corresponds to the outputs of the first input stage 203 and the second input stage 209, and the second pole corresponds to the outputs of the first output stage 206 and the second output stage 213. In order for the first differential line driver 200 to be stable, the unity gain bandwidth of the first differential line driver 200 should be lower than the frequency of the second pole. If the unity gain bandwidth of the first differential line driver 200 is greater than the frequency of the second pole, the first differential output signal $v_{o1}$ and/or the second differential output signal $v_{o2}$ may oscillate undesirably. Because the transconductances of the second transconductance stage 219 and the fourth transconductance stage 226 may increase as the output current $i_o$ increases, the first differential line driver 200 may be unstable due to a relatively large output current $i_o$, causing the unity gain bandwidth to be greater than the frequency of the second pole.

Figure 2B:
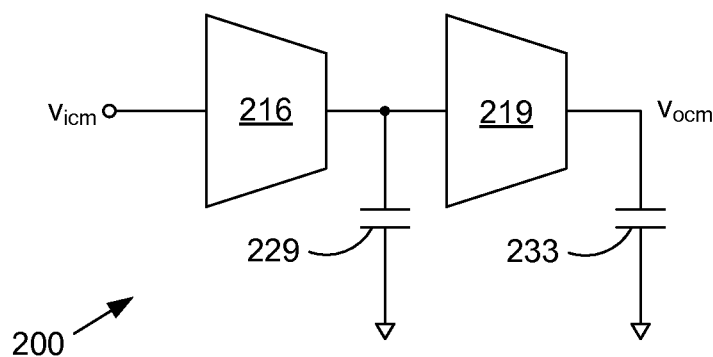

With reference to FIG. 2B, shown is a schematic diagram representing an equivalent circuit of the first differential line driver 200 shown in FIG. 2A. In particular, FIG. 2B shows an example of a common-mode equivalent circuit for the first differential line driver 200 shown in FIG. 2A. The common-mode equivalent circuit shown in FIG. 2B includes the first transconductance stage 216, the second transconductance stage 219, a first capacitor 229 and a second capacitor 233. The first capacitor 229 and the second capacitor 233 represent parasitic capacitances that can be associated with the first differential line driver 200.

The first transconductance stage 216 receives a common-mode input component $v_{icm}$ of the first differential input signal $v_{i1}$ (FIG. 2A), and the second transconductance stage 219 generates a common-mode output component $v_{ocm}$ of the first differential output signal $v_{o1}$ (FIG. 2A). The transfer function of the common-mode equivalent circuit for the first differential line driver 200 has two poles. The first pole corresponds to the output of the first transconductance stage 216, and the second pole corresponds to the output of the second transconductance stage 219. The frequency of the second pole can be represented using, for example, the following equation:

$$f = \frac{1}{RC},$$ [Equation 1]

where f is the frequency of the second pole, R represents the value of the resistance between the output of the second transconductance stage 219 and ground, and C represents the value of the capacitance between the output of the second transconductance stage 219 and ground. Because the resistance between the output of the second transconductance stage 219 and ground is approximately infinite (i.e., there is no resistor between the second transconductance stage 219 and ground), the frequency of the second pole is approximately zero. However, as previously mentioned, the unity gain bandwidth for the first differential line driver 200 should be less than the frequency of its second pole in order for the first differential line driver 200 to be stable. Because the second pole for the common-mode equivalent circuit of the first differential line driver 200 is approximately zero, the first differential line driver 200 is likely to be unstable with respect to its common-mode operation.

Figure 2C:
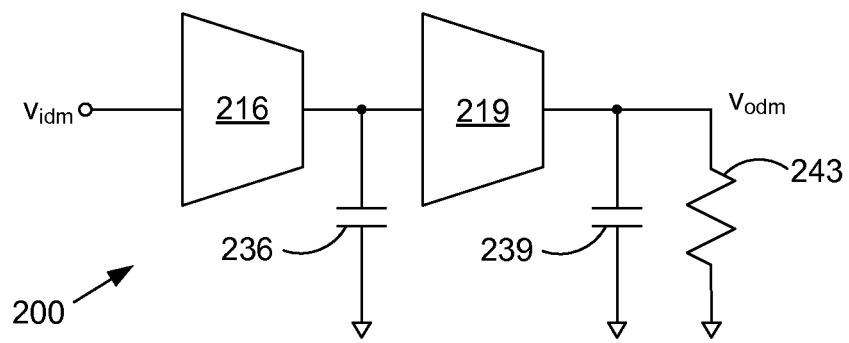

With reference to FIG. 2C, shown is a schematic diagram representing another equivalent circuit of the first differential line driver 200. In particular, FIG. 2C shows an example of a differential-mode equivalent circuit for the first differential line driver 200. The differential-mode equivalent circuit shown in FIG. 2C includes the first transconductance stage 216, the second transconductance stage 219, a first capacitor 236, a second capacitor 239, and a resistor 243. The first capacitor 236 and the second capacitor 239 represent parasitic capacitances that can be associated with the first differential line driver 200. The resistor 243 represents the differential-mode equivalent resistance of the load 116 (FIG. 2A). The resistance value of the resistor 243 is half of the total resistance value of the load 116.

The first transconductance stage 216 receives a differential-mode input component $v_{idm}$ of the first differential input signal $v_{i1}$ (FIG. 2A), and the second transconductance stage 219 generates a differential-mode output component $V_{odm}$ of the first differential output signal $v_{o1}$ (FIG. 2A). The transfer function of the differential-mode equivalent circuit for the first differential line driver 200 also has two poles, and the frequency of the second pole can be represented using equation 1. Because the value of the resistor 243 is relatively small, the frequency of the second pole for the differential-mode equivalent circuit for the first differential line driver 200 is relatively high. As such, it is likely that the first differential line driver 200 is stable with respect to its differential-mode operation.

Figure 3A:
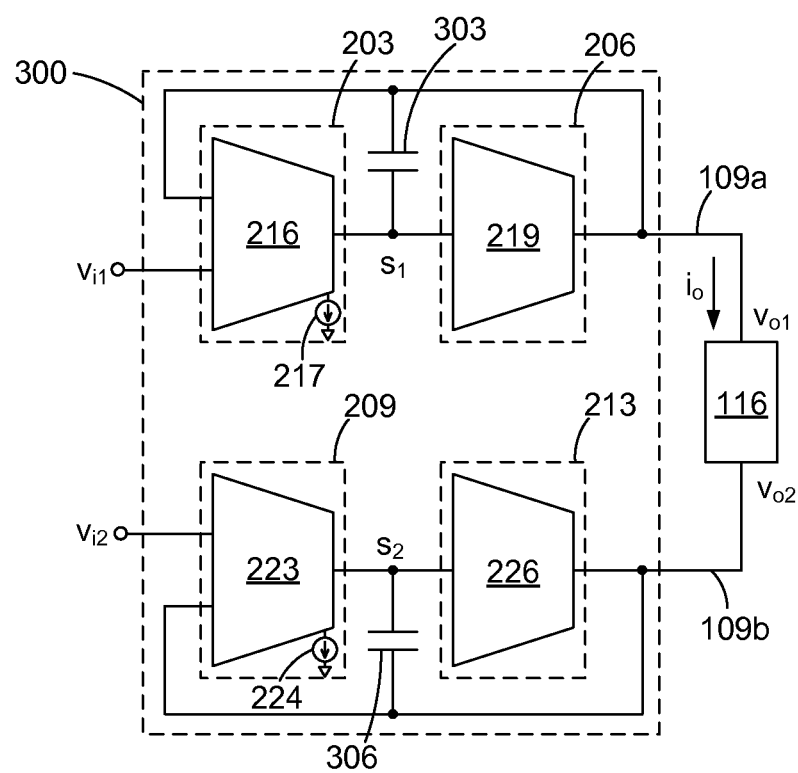
FIGS. 3A-3C are schematic diagrams representing a second example of a differential line driver employed in the communication environment of FIG. 1 according to various embodiments of the present disclosure.

With reference to FIG. 3A, shown is a schematic diagram representing a second example of the differential line driver 113 (FIG. 1), referred to herein as the second differential line driver 300, according to various embodiments of the present disclosure. The second differential line driver 300 is shown coupled to the load 116 of the receiver 106 (FIG. 1) via the first line 109a and the second line 109b.

The second differential line driver 300 is similar to the first differential line driver 200 shown in FIG. 2A. However, the second differential line driver 300 further includes a first capacitor 303 and a second capacitor 306. The first capacitor 303 is coupled between the input and the output of the first output stage 206. Similarly, the second capacitor 306 is coupled between the input and the output of the second output stage 213. As such, the first capacitor 303 and the second capacitor 306 may be regarded as being Miller compensation capacitors. In various embodiments, one or more resistances or other types of components may be coupled to the first capacitor 303 and/or the second capacitor 306 in series or in parallel.

Figure 3B:
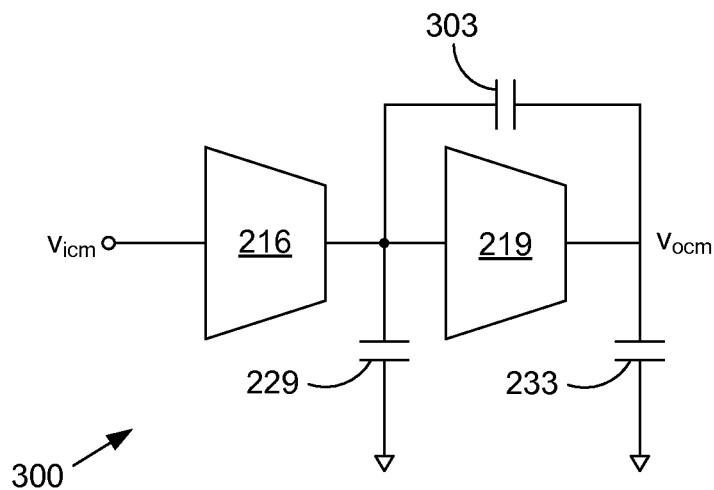

With reference to FIG. 3B, shown is a schematic diagram representing an equivalent circuit of the second differential line driver 300. In particular, FIG. 3B shows an example of a common-mode equivalent circuit for the second differential line driver 300. The common-mode equivalent circuit of the second differential line driver 300 is similar to the common-mode equivalent circuit of the first differential line driver 200 (FIG. 2B). However, the common-mode equivalent circuit of the second differential line driver 300 further includes the first capacitor 303 coupled between the input and the output of the second transconductance stage 219.

The first capacitor 303 acts as a Miller compensation capacitor for the common-mode operation of the second differential line driver 300. As such, the first capacitor 303 causes the frequency of the second pole for common-mode operation of the second differential line driver 300 to be higher than the frequency of the second pole for the common-mode operation of the first differential line driver 200. Additionally, the first capacitor 303 causes the common-mode unity gain bandwidth of the second differential line driver 300 to be lower than the unity gain bandwidth of the common-mode unity gain bandwidth of the first differential line driver 200. Thus, the first capacitor 303 may cause the second differential line driver 300 to be stable for its common-mode operation.

Figure 3C:
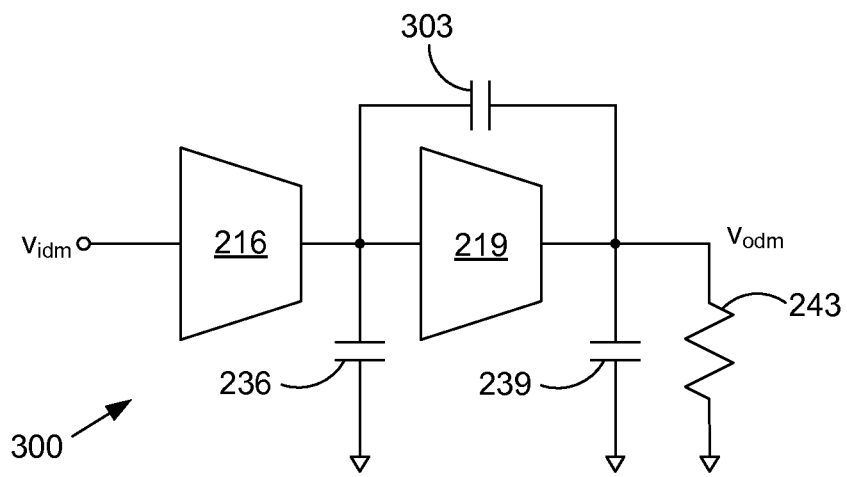

With reference to FIG. 3C, shown is a schematic diagram representing an equivalent circuit of the second differential line driver 300. In particular, FIG. 3C shows an example of a differential-mode equivalent circuit for the second differential line driver 300. The differential-mode equivalent circuit of the second differential line driver 300 is similar to the differential-mode equivalent circuit of the first differential line driver 200 (FIG. 2C). However, the differential-mode equivalent circuit of the second differential line driver 300 further includes the first capacitor 303 coupled between the input and the output of the second transconductance stage 219.

The first capacitor 303 acts as a Miller compensation capacitor for the differential-mode operation of the second differential line driver 300. As such, the first capacitor 303 causes the frequency of the second pole for the differential-mode operation of the second differential line driver 300 to be higher than the frequency of the second pole for the differential-mode operation of the first differential line driver 200. Additionally, the first capacitor 303 causes the differential-mode unity gain bandwidth of the second differential line driver 300 to be lower than the differential-mode unity gain bandwidth of the first differential line driver 200. Because the differential-mode operation of the first differential line driver 200 is stable without the use of a Miller compensation capacitor, the first capacitor 303 may cause the differential-mode unity gain bandwidth of the second differential line driver 300 to be lower than what is required to satisfy the stability requirements.

Thus, the first capacitor 303 may cause the second differential line driver 300 to be stable for its common-mode operation. However, the first capacitor 303 may have an undesirable effect on the differential-mode unity gain bandwidth.

Figure 4A:
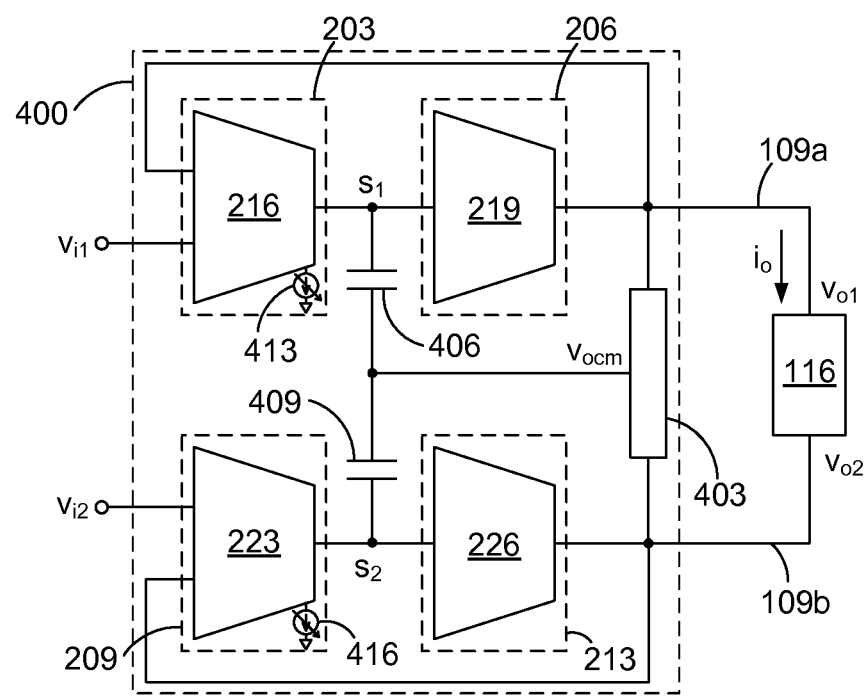
FIGS. 4A-4C are schematic diagrams representing a third example of a differential line driver employed in the communication environment of FIG. 1 according to various embodiments of the present disclosure.

With reference to FIG. 4A, shown is a schematic diagram representing a third example of the differential line driver 113 (FIG. 1), referred to herein as the third differential line driver 400, according to various embodiments of the present disclosure. The third differential line driver 400 is shown coupled to the load 116 of the receiver 106 (FIG. 1) via the first line 109a and the second line 109b.

The third differential line driver 400 is similar to the first differential line driver 200 (FIG. 2A). However, the third differential line driver 400 further comprises an output common-mode voltage sense 403, a first capacitor 406, a second capacitor 409, and potentially other components. Additionally, the first input stage 203 further comprises a first dynamic bias current 413 for the first transconductance stage 216, and the second input stage 209 further comprises a second dynamic bias current 416 for the third transconductance stage 223.

The inputs of the output common-mode voltage sense 403 are coupled to the output of the first output stage 206 and to the output of the second output stage 213, respectively. Additionally, the output of the output common-mode voltage sense 403 is coupled to the first capacitor 406 and to the second capacitor 409. The output common-mode voltage sense 403 in various embodiments may comprise, for example but not limited to, a center-tapped resistor. For such embodiments, the center tap of the center-tapped resistor can be coupled to the first capacitor 406 and the second capacitor 409, and the input terminals of the center-tapped resistor can be coupled to the outputs of the first output stage 206 and the second output stage 213, respectively. In alternative embodiments where the receiver 106 (FIG. 1) is in close proximity to the transmitter 103 (FIG. 1), the output common-mode voltage sense 403 can be located in the receiver 106, and the output of the output common-mode voltage sense 403 can be provided to the third differential line driver 400 using a wire, cable, conductive trace, or any other type of conductive medium.

The output common-mode voltage sense 403 is configured to decouple the common-mode output component $v_{ocm}$ of the first differential output signal $v_{o1}$ and the second differential output signal $v_{o2}$. In this regard, the output common-mode voltage sense 403 provides the common-mode output component $v_{ocm}$ as an output signal. Additionally, the output common-mode voltage sense 403 provides the common-mode output component $v_{ocm}$ to the first capacitor 406 and the second capacitor 409.

The first dynamic bias current 413 for the first transconductance stage 216 and the second dynamic bias current 416 for the third transconductance stage 223 are configured to adjust in response to the output current $i_o$ of the third differential line driver 400. To this end, input circuitry associated with the first dynamic bias current 413 and/or the second dynamic bias current 416 may be in communication with, for example, the first differential input signal $v_{i1}$, the second differential input signal $v_{i2}$, the first differential output signal $v_{o1}$, the second differential output signal $v_{o2}$, and/or any other signal that can be used to provide a signal that increases and decreases in accordance with the output current $i_o$.

In particular, the first dynamic bias current 413 and the second dynamic bias current 416 may adjust inversely to the output current $i_o$. For example, the first dynamic bias current 413 and the second dynamic bias current 416 may be represented using the following equation:

$$i_b = i_1 - \alpha * |i_o|, \quad \text{[Equation 2]}$$

where $i_b$ is the value of the first dynamic bias current 413 or the second dynamic bias current 416, $i_1$ is a constant value, $\alpha$ represents a coefficient value, and $i_o$ is the value of the output current $i_o$. As can be seen from equation 2, the first dynamic bias current 413 and the second dynamic bias current 416 decrease as the output current $i_o$ increases. Thus, the first dynamic bias current 413 and the second dynamic bias current 416 may mitigate the unity gain bandwidth of the third differential line driver 400 increasing or decreasing as a function of the output current $i_o$, which would otherwise result if the first dynamic bias current 413 and the second dynamic bias current 416 were fixed.

Figure 4B:
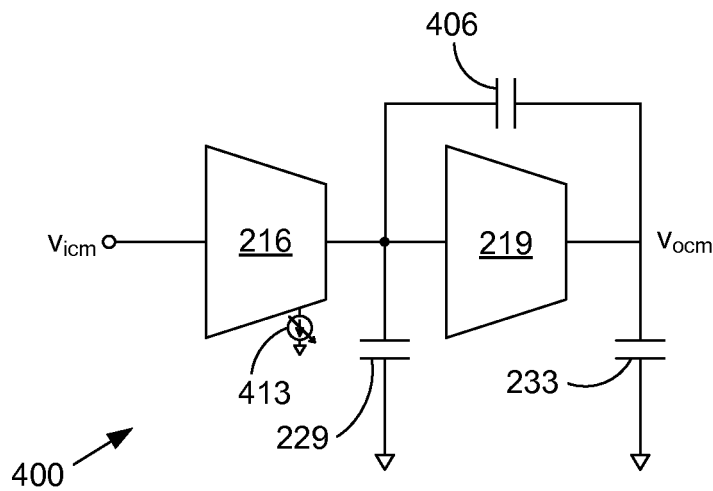

With reference to FIG. 4B, shown is a schematic diagram representing an equivalent circuit of the third differential line driver 400. In particular, FIG. 4B shows an example of a common-mode equivalent circuit for the third differential line driver 400. The common-mode equivalent circuit of the third differential line driver 400 is similar to the common-mode equivalent circuit of the first differential line driver 200 (FIG. 2B). However, the common-mode equivalent circuit of the third differential line driver 400 further includes the first capacitor 406 coupled between the input and the output of the second transconductance stage 219. Additionally, the first dynamic bias current 413 for the first transconductance stage 216 is shown in conjunction with the first transconductance stage 216.

The first capacitor 406 acts as a Miller compensation capacitor for the common-mode operation of the third differential line driver 400. In this regard, the first capacitor 406 causes the frequency of the second pole for the common-mode operation of the third differential line driver 400 to be higher than the frequency of the second pole for the common-mode operation of the first differential line driver 200. Additionally, the first capacitor 406 causes the common-mode unity gain bandwidth of the third differential line driver 400 to be lower than the common-mode unity gain bandwidth of the first differential line driver 200. Thus, the first capacitor 406 may cause the second differential line driver 300 to be stable for its common-mode operation.

Figure 4C:
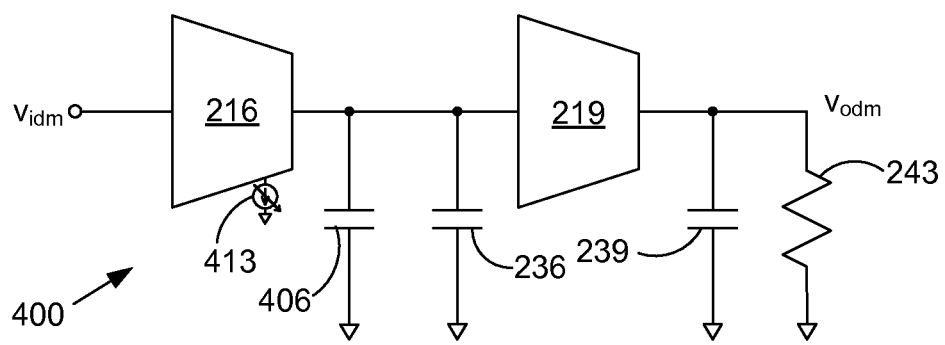

With reference to FIG. 4C, shown is a schematic diagram representing an equivalent circuit of the third differential line driver 400. In particular, FIG. 4C shows an example of a differential-mode equivalent circuit for the third differential line driver 400. The differential-mode equivalent circuit of the third differential line driver 400 is similar to the differential-mode equivalent circuit of the first differential line driver 200 (FIG. 2C). However, the differential-mode equivalent circuit of the third differential line driver 400 further includes the first capacitor 406 coupled between the output of the first transconductance stage 216 and ground.

The effect of the first capacitor 406 for the differential mode of operation of the third differential line driver 400 is merely a loading effect. As such, the first capacitor 406 may not significantly affect the frequency of the second pole or the unity gain bandwidth for the differential mode of operation of the third differential line driver 400. Thus, the first capacitor 406 acts as a Miller compensation capacitor for the common-mode operation of the third differential line driver 400 but does not significantly alter the differential-mode operation of the third differential line driver 400, as compared to the first differential line driver 200.

Figure 5A:
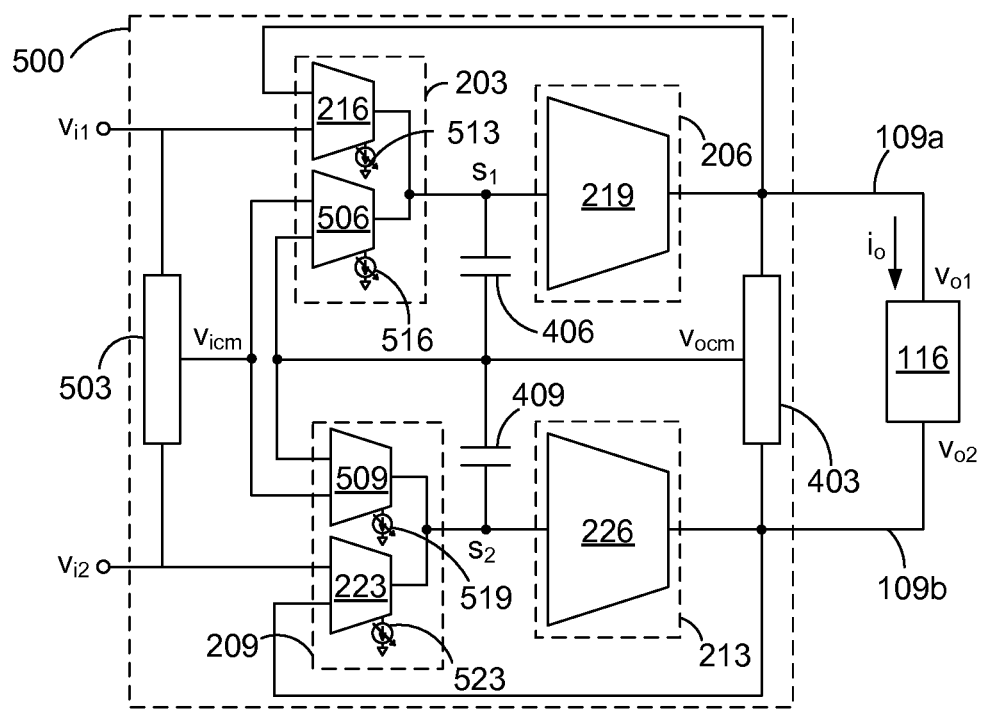
FIGS. 5A-5C are schematic diagrams representing a fourth example of a differential line driver employed in the communication environment of FIG. 1 according to various embodiments of the present disclosure.

With reference to FIG. 5A, shown is a schematic diagram representing a fourth example of the differential line driver 113 (FIG. 1), referred to herein as the fourth differential line driver 500, according to various embodiments of the present disclosure. The fourth differential line driver 500 is shown coupled to the load 116 of the receiver 106 (FIG. 1) via the first line 109a and the second line 109b.

The fourth differential line driver 500 is similar to the third differential line driver 400 (FIG. 4A). However, the fourth differential line driver 500 further comprises an input common-mode voltage sense 503. Additionally, the first input stage 203 further comprises a first common-mode transconductance stage 506, and the second input stage 209 further comprises a second common-mode transconductance stage 509.

The inputs of the input common-mode voltage sense 503 are coupled to the inputs of the first transconductance stage 216 and the third transconductance stage 223, respectively. Additionally, the output of the input common-mode voltage sense 503 is coupled to the inputs of the first common-mode transconductance stage 506 and the second common-mode transconductance stage 509. The output of the output common-mode voltage sense 403 is also coupled to the inputs of the first common-mode transconductance stage 506 and the second common-mode transconductance stage 509.

The input common-mode voltage sense 503 in various embodiments may comprise, for example but not limited to, a center-tapped resistor. For such embodiments, the center tap of the center-tapped resistor can be coupled to the first common-mode transconductance stage 506 and the second common-mode transconductance stage 509, and the input terminals of the center-tapped resistor can be coupled to the inputs of the first transconductance stage 216 and the third transconductance stage 223, respectively. In alternative embodiments the input common-mode voltage sense 503 can be a part of the circuitry that provides the first differential input signal $v_{i1}$ and the second differential input signal $v_{i2}$, and the output of the input common-mode voltage sense 503 can be provided to the fourth differential line driver 500 using a wire, cable, conductive trace, or any other type of conductive medium.

The input common-mode voltage sense 503 is configured to decouple the common-mode input component $v_{icm}$ of the first differential input signal $v_{i1}$ and the second differential input signal $v_{i2}$. In this regard, the input common-mode voltage sense 503 provides the common-mode input component $v_{icm}$ as an output signal. Additionally, the input common-mode voltage sense 503 provides the common-mode input component $v_{icm}$ to the first common-mode transconductance stage 506 and the second common-mode transconductance stage 509.

The inputs of the first common-mode transconductance stage 506 are coupled to the output of the input common-mode voltage sense 503 and the output of the output common-mode voltage sense 403. The output of the first common-mode transconductance stage 506 is combined with the output of the first transconductance stage 216. A first dynamic bias current 513 and a second dynamic bias current 516 are also associated with the first common-mode transconductance stage 506.

The first common-mode transconductance stage 506 outputs a current responsive to the common-mode input component $v_{icm}$ and the common-mode output component $v_{ocm}$. The current that is output from the first common-mode transconductance stage 506 is combined with the current output from the first transconductance stage 216. Additionally, the first input stage 203 is configured so that the current that is output from the first common-mode transconductance stage 506 is subtracted from the current that is output from the first transconductance stage 216. Thus, the first signal $s_1$ that is output from the first input stage 203 is responsive to the first differential input signal $v_{i1}$ with the common-mode input component $v_{icm}$ at least partially removed.

The inputs of the second common-mode transconductance stage 509 are coupled to the output of the input common-mode voltage sense 503 and the output of the output common-mode voltage sense 403. The output of the second common-mode transconductance stage 509 is combined with the output of the third transconductance stage 223. A third dynamic bias current 519 and a fourth dynamic bias current 523 are also associated with the second common-mode transconductance stage 509.

The second common-mode transconductance stage 509 outputs a current responsive to the common-mode input component $v_{icm}$ and the common-mode output component $v_{ocm}$. The current that is output from the second common-mode transconductance stage 509 is combined with the current output from the third transconductance stage 223. Additionally, the second input stage 209 is configured so that the current that is output from the second common-mode transconductance stage 509 is subtracted from the current that is output from the third transconductance stage 223. Thus, the second signal $s_2$ that is output from the second input stage 209 is responsive to the second differential input signal $v_{i2}$ with the common-mode input component $v_{icm}$ at least partially removed. As such, the first common-mode transconductance stage 506 causes the common-mode transconductance of the first input stage 203 to be reduced without significantly impacting the differential-mode transconductance of the first input stage 203. Similarly, the second common-mode transconductance stage 509 causes the common-mode transconductance of the second input stage 209 to be reduced without significantly impacting the differential-mode transconductance of the second input stage 209.

Because the first signal $s_1$ and the second signal $s_2$ for the fourth differential line driver 500 are responsive to the first differential input signal $v_{i1}$ and the second differential input signal $v_{i2}$ with the common-mode input component $v_{icm}$ at least partially removed, the first differential output signal $v_{o1}$ and the second differential output signal $v_{o2}$ have a reduced common-mode output component $v_{ocm}$, as compared to the common-mode output component $v_{ocm}$ of the third differential line driver 400 (FIG. 4B). Thus, the common-mode unity gain bandwidth for the fourth differential line driver 500 is less than the common-mode unity gain bandwidth for the third differential line driver 400.

Figure 5B:
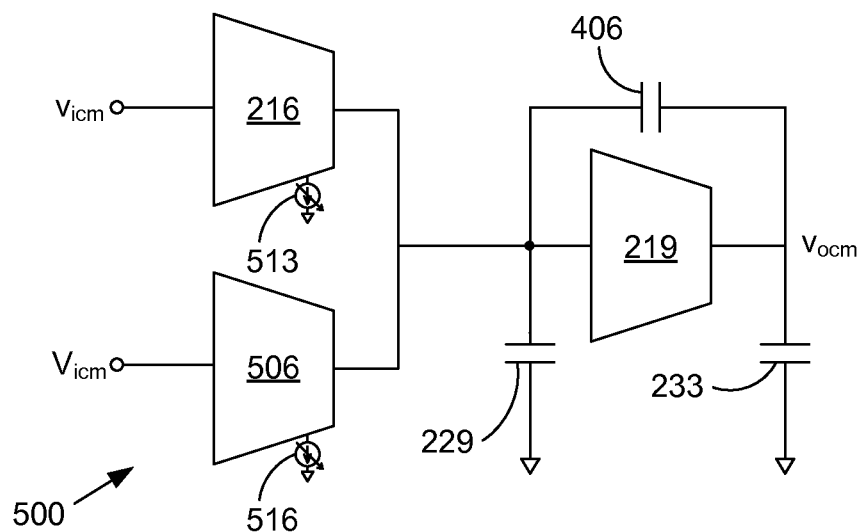

With reference to FIG. 5B, shown is a schematic diagram representing an equivalent circuit of the fourth differential line driver 500. In particular, FIG. 5B shows an example of a common-mode equivalent circuit for the fourth differential line driver 500. The common-mode equivalent circuit of the fourth differential line driver 500 is similar to the common-mode equivalent circuit of the third differential line driver 400 (FIG. 4B). However, the common-mode equivalent circuit of the fourth differential line driver 500 further includes the first common-mode transconductance stage 506 and the second dynamic bias current 516.

The first common-mode transconductance stage 506 generates an output current that is responsive to the common-mode input component $v_{icm}$ of the first differential input signal $v_{i1}$ (FIG. 5A). The output current from the first common-mode transconductance stage 506 is subtracted from the output current from the first transconductance stage 216. In effect, the common-mode unity gain bandwidth for the fourth differential line driver 500 is less than the common-mode unity gain bandwidth for the third differential line driver 400. As such, the minimum capacitance value for the first capacitor 406 that would satisfy the stability requirements for the fourth differential line driver 500 is less than the minimum capacitance value for the first capacitor 406 that would satisfy the stability requirements for the third differential line driver 400. As a result, the first capacitor 406 for the fourth differential line driver 500 may occupy a smaller area on a chip or printed circuit board as compared to the first capacitor 406 for the third differential line driver 400.

Figure 5C:
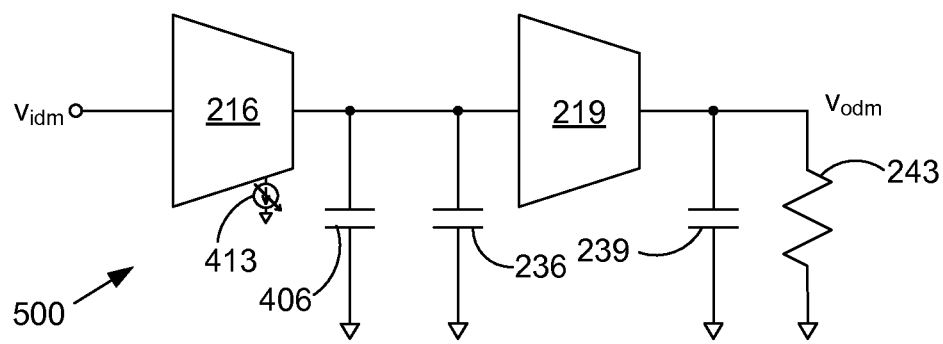

With reference to FIG. 5C, shown is a schematic diagram representing an equivalent circuit of the fourth differential line driver 500. In particular, FIG. 5C shows an example of a differential-mode equivalent circuit for the fourth differential line driver 500. The differential-mode equivalent circuit of the fourth differential line driver 500 is similar to the differential-mode equivalent circuit of the third differential line driver 400 (FIG. 4C). As shown, the first common-mode transconductance stage 506 (FIG. 5A) does not affect the differential-mode operation of the fourth differential line driver 500. However, because the capacitance value of the first capacitor 406 for the fourth differential line driver 500 may be smaller than the capacitance value of the first capacitor 406 for the third differential line driver 400, the loading effect from the first capacitor 406 on the fourth differential line driver 500 may be less than the loading effect for the third differential line driver 400.

Figure 6:
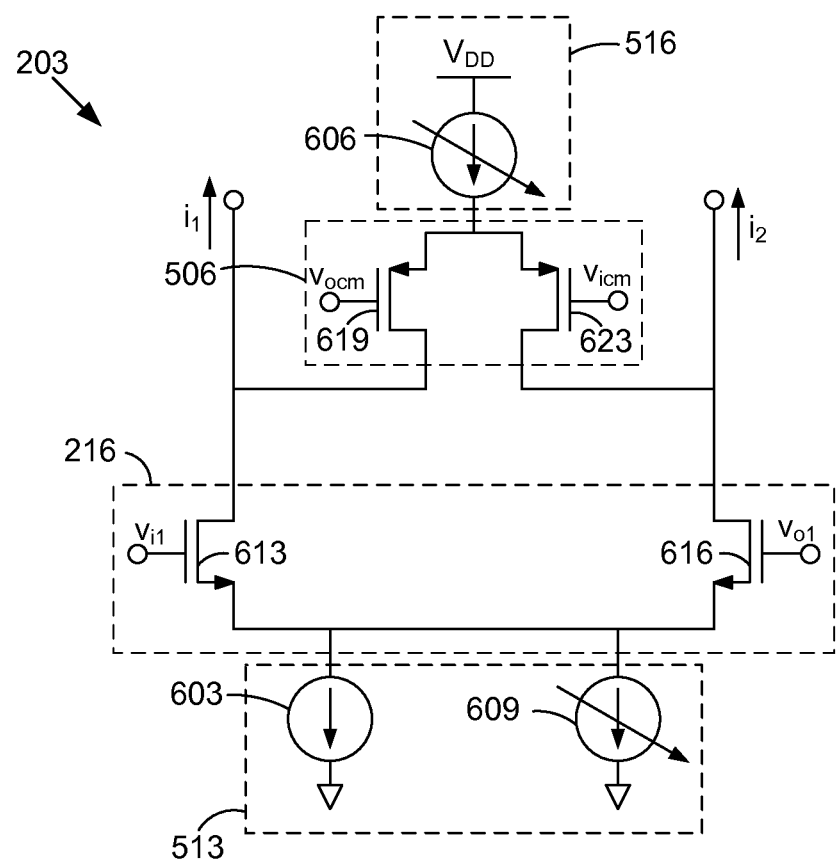
FIG. 6 is a schematic diagram representing an example of an input stage that may be employed in the differential line driver of FIG. 5A according to various embodiments of the present disclosure.

With reference to FIG. 6, shown is a schematic diagram representing an example of the first input stage 203 for the fourth differential line driver 500 (FIG. 5A) according to various embodiments of the present disclosure. The second input stage 209 of the fourth differential line driver 500 may be similar to the first input stage 203 shown in FIG. 6.

The first input stage 203 in the embodiment shown in FIG. 6 comprises the first common-mode transconductance stage 506, the first transconductance stage 216, the first dynamic bias current 513, and the second dynamic bias current 516. The first dynamic bias current 513 comprises a fixed current source 603 and a first dynamic current source 609. The second dynamic bias current 516 comprises a second dynamic current source 606.

The first transconductance stage 216 in the embodiment shown in FIG. 6 comprises a first transistor 613 and a second transistor 616. The first transistor 613 and the second transistor 616 may each comprise, for example, an N-type metal-oxide-semiconductor (MOS) transistor or any other suitable type of device.

The source of the first transistor 613 is coupled to the source of the second transistor 616. Additionally, the source of the first transistor 613 is coupled to the fixed current source 603 and the first dynamic current source 609, as shown. The gate of the first transistor 613 receives the first differential input signal $v_{i1}$, and the gate of the second transistor 616 receives the first differential output signal $v_{o1}$. The drain of the first transistor 613 and the drain of the second transistor 616 are coupled to the line for the first signal $s_1$, as shown.

The first common-mode transconductance stage 506 in the embodiment shown in FIG. 6 comprises a third transistor 619 and a fourth transistor 623. The third transistor 619 and the fourth transistor 623 may each comprise, for example, a P-type MOS transistor or any other suitable type of device.

The source of the third transistor 619 and the source of the fourth transistor 623 are coupled to the second dynamic current source 606. The drain of the third transistor 619 and the drain of the fourth transistor 623 are coupled to the line for the first signal $s_1$. The gate for the third transistor 619 receives the common-mode output component $v_{ocm}$, and the gate for the fourth transistor 623 receives the common-mode input component $v_{icm}$.

The fixed current source 603 provides a current that has a relatively fixed value. For example, the current provided by the fixed current source 603 may be represented by the following equation:

$$i_f = \frac{i_n}{2}, \quad \text{[Equation 3]}$$

where $i_f$ represents the value of the current provided by the fixed current source 603 and $i_n$ is a constant value.

The second dynamic current source 606 provides a current that increases as the value of the output current $i_o$ (FIG. 5A) decreases and that decreases as the output current $i_o$ increases. For example, the current provided by the second dynamic current source 606 may be represented by the following equation:

$$i_{d1} = \frac{i_n}{2} - \alpha * |i_o|, \quad \text{[Equation 4]}$$

where $i_{d1}$ represents the value of the current provided by the second dynamic current source 606, $i_n$ is the constant value from equation 3, $\alpha$ represents a coefficient value, and $i_o$ is the value of the output current $i_o$.

The first dynamic current source 609 provides a current that increases as the value of the output current $i_o$ decreases and that decreases as the output current $i_o$ increases. For example, the current provided by the first dynamic current source 609 may be represented by the following equation:

$$i_{d2} = \frac{i_n}{2} - \beta * |i_o|, \quad \text{[Equation 5]}$$

where $i_{d2}$ represents the value of the current provided by the first dynamic current source 609, $i_n$ is the constant value from equation 3, $\beta$ represents a coefficient value that may or may not be equal to $\alpha$, and $i_o$ is the value of the output current $i_o$.

The first transistor 613 and the second transistor 616 adjust a first current $i_1$ and a second current $i_2$, respectively, responsive to the first differential input signal $v_{i1}$ and the first differential output signal $v_{o1}$. The third transistor 619 and the fourth transistor 623 also adjust the first current $i_1$ and the second current $i_2$, respectively, responsive to the common-mode output component $v_{ocm}$ of the first differential output signal $v_{o1}$ and the common-mode input component $v_{icm}$ of the first differential input signal $v_{i1}$. Additionally, the first current $i_1$ and the second current $i_2$ are further adjusted due to the second dynamic current source 606 and the first dynamic current source 609 responding to the output current $i_o$ for the fourth differential line driver 500. The difference between the first current $i_1$ and the second current $i_2$ are used to create the signal $s_1$ (FIG. 5A). Thus, the current for the signal $s_1$ may adjust in response to the first differential input signal $v_{i1}$, the first differential output signal $v_{o1}$, the common-mode input component $v_{icm}$, the common-mode output component $v_{ocm}$, and/or the output current $i_o$.

It is noted that the current that flows through the first common-mode transconductance stage 506 also flows through the first transconductance stage 216. Thus, the addition of the first common-mode transconductance stage 506 and the second common-mode transconductance stage 509 (FIG. 5A) use a relatively small amount of additional current than would otherwise be used. Additionally, because both the first dynamic current source 609 and the second dynamic current source 606 respond to the magnitude of the output current $i_o$, common mode disturbances from the changes due to the output current $i_o$ may not be transferred to the second transconductance stage 219

Figure 7:
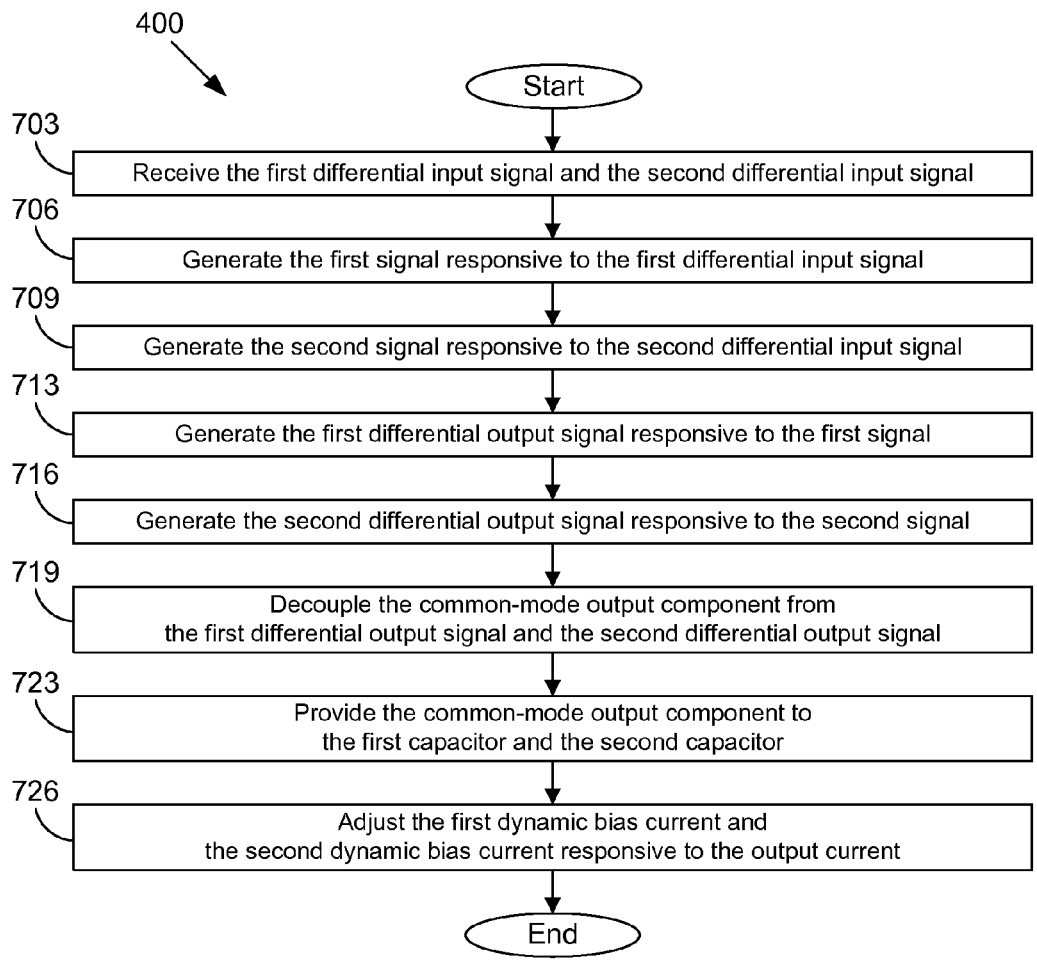
FIG. 7 is a flowchart illustrating an example of functionality implemented by the differential line driver of FIG. 4A according to various embodiments of the present disclosure.

With reference to FIG. 7, shown is a flowchart illustrating an example of functionality implemented by the third differential line driver 400 according to various embodiments of the present disclosure. The flowchart of FIG. 7 provides merely one example of the many different types of functionality that may be implemented by the third differential line driver 400 as described herein. Additionally, the flowchart of FIG. 7 may be viewed as depicting an example of steps of a method implemented in the transmitter 103 (FIG. 1) according to one or more embodiments.

At 703, the first differential input signal $v_{i1}$ and the second differential input signal $v_{i2}$ are received by the third differential line driver 400. In particular, the first differential input signal $v_{i1}$ is received by the first input stage 203 (FIG. 4A), and the second differential input signal $v_{i2}$ is received by the second input stage 209 (FIG. 4A). The first input stage 203 generates the first signal $s_1$ responsive to the first differential input signal $v_{i1}$, as shown at 706. In particular, the current for the first signal $s_1$ increases or decreases in response to the first differential input signal $v_{i1}$. Similarly, the second input stage 209 generates the second signal $s_2$ responsive to the second differential input signal $v_{i2}$, as indicated at 709. Similar to the first signal $s_1$ with respect to the first differential signal input $v_{i1}$, the second signal $s_2$ increases or decreases in response to the second differential input signal $v_{i2}$.

At 713, the first differential output signal $v_{o1}$ is generated by the first output stage 206 (FIG. 4A) responsive to the first signal $s_1$. The second differential output signal $v_{o2}$ is generated by the second output stage 213 (FIG. 4A) responsive to the second signal $s_2$, as indicated at 716. As shown at 719, the common-mode output component $v_{ocm}$ is decoupled from the first differential output signal $v_{o1}$ and the second differential output signal $v_{o2}$. To this end, the output common-mode voltage sense 403 (FIG. 4A) comprises inputs that are coupled to the output of the first output stage 206 and the output of the second output stage 213, respectively.

As shown at 723, the common-mode output component $v_{ocm}$ is provided to the first capacitor 406 (FIG. 4A) and the second capacitor 409 (FIG. 4A) by the output common-mode voltage sense 403. Because the first capacitor 406 and the second capacitor 409 are coupled to the output of the output common-mode voltage sense 403 and to the input of the first output stage 206 and the second output stage 213, respectively, the first capacitor 406 and the second capacitor 409 cause the common-mode unity gain of the third differential line driver 400 to be decreased as compared to the second differential line driver 300 (FIG. 3A). Additionally, the first capacitor 406 and the second capacitor 409 cause the frequency of the second pole of the common-mode transfer function for the third differential line driver 400 to be increased as compared to the second differential line driver 300.

The first dynamic bias current 413 (FIG. 4A) and the second dynamic bias current 416 (FIG. 4A) also adjust responsive to the output current $i_o$, as indicated at 726. Decreasing the first dynamic bias current 413 and/or the second dynamic bias current 416 as the output current $i_o$ increases can prevent the third differential line driver 400 from becoming unstable. Thereafter, the process ends.

Figure 8:
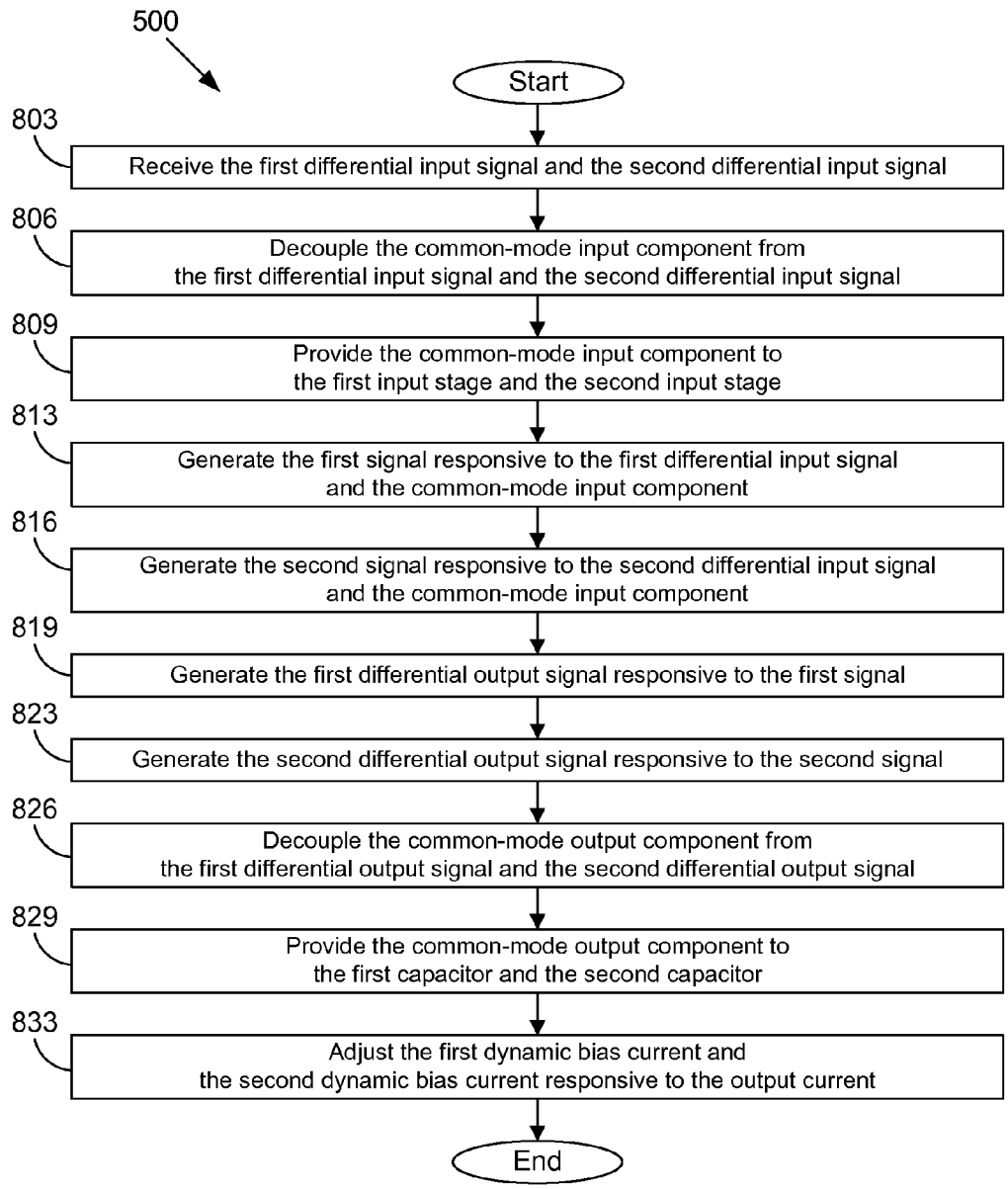
FIG. 8 is a flowchart illustrating an example of functionality implemented by the differential line driver of FIG. 5A according to various embodiments of the present disclosure.

With reference to FIG. 8, shown is a flowchart illustrating an example of functionality implemented by the fourth differential line driver 500 according to various embodiments of the present disclosure. The flowchart of FIG. 8 provides merely one example of the many different types of functionality that may be implemented by the fourth differential line driver 500 as described herein. Additionally, the flowchart of FIG. 8 may be viewed as depicting an example of steps of a method implemented in the transmitter 103 (FIG. 1) according to one or more embodiments.

At 803, the first differential input signal $v_{i1}$ and the second differential input signal $v_{i2}$ are received by the fourth differential line driver 500. In particular, the first differential input signal $v_{i1}$ is received by the first input stage 203 (FIG. 5A), and the second differential input signal $v_{i2}$ is received by the second input stage 209 (FIG. 5A). As indicated at 806, the common-mode input component $v_{icm}$ is decoupled from the first differential input signal $v_{i1}$ and the second differential input signal $v_{i2}$. To this end, the inputs of the input common-mode voltage sense 503 (FIG. 5A) are coupled to the inputs of the first input stage 203 and the second input stage 209. As shown at 809, the common-mode input component $v_{icm}$ is provided to the first input stage 203 and the second input stage 209. In particular, the common-mode input component $v_{icm}$ is provided to the first common-mode transconductance stage 506 (FIG. 5A) and the second common-mode transconductance stage 509 (FIG. 5A).

The first input stage 203 generates the first signal $s_1$ responsive to the first differential input signal $v_{i1}$ and the common-mode input component $v_{icm}$, as shown at 813. In particular, the first signal $s_1$ increases or decreases in response to the first differential input signal $v_{i1}$ with the common-mode input component $v_{icm}$, at least partially removed. Similarly, the second input stage 209 generates the second signal $s_2$ responsive to the second differential input signal $v_{i2}$ and the common-mode input component $v_{icm}$, as indicated at 816. Similar to the first signal $s_1$ with respect to the first differential signal input $v_{i1}$, the second signal $s_2$ increases or decreases in response to the second differential input signal $v_{i2}$ with the common-mode input component $v_{icm}$ at least partially removed.

At 819, the first differential output signal $v_{o1}$ is generated by the first output stage 206 (FIG. 5A) responsive to the first signal $s_1$. The second differential output signal $v_{o2}$ is generated by the second output stage 213 (FIG. 5A) responsive to the second signal $s_2$, as indicated at 823. As shown at 826, the common-mode output component $v_{ocm}$ is decoupled from the first differential output signal $v_{o1}$ and the second differential output signal $v_{o2}$. To this end, the output common-mode voltage sense 403 (FIG. 5A) comprises inputs that are coupled to the output of the first output stage 206 and the output of the second output stage 213, respectively.

As shown at 829, the common-mode output component $v_{ocm}$ is provided to the first capacitor 406 (FIG. 5A) and the second capacitor 409 (FIG. 5A) by the output common-mode voltage sense 403. Because the first capacitor 406 and the second capacitor 409 are coupled to the output of the output common-mode voltage sense 403 and to the input of the first output stage 206 and the second output stage 213, respectively, the first capacitor 406 and the second capacitor 409 cause the common-mode unity gain of the fourth differential line driver 500 to be decreased as compared to the second differential line driver 300 (FIG. 3A). Additionally, the first capacitor 406 and the second capacitor 409 cause the frequency of the second pole of the common-mode transfer function for the fourth differential line driver 500 to be increased as compared to the second differential line driver 300.

The first dynamic bias current 513 (FIG. 5A) and the second dynamic bias current 516 (FIG. 5A) also adjust responsive to the output current $i_o$, as shown at 833. Decreasing the first dynamic bias current 513 and/or the second dynamic bias current 516 as the output current $i_o$ increases can prevent the fourth differential line driver 500 from becoming unstable. Thereafter, the process ends.

Although the flowcharts of FIGS. 7-8 show a specific order of performance, it is understood that the order of performance may differ from that which is depicted. For example, the order of performance of two or more numbers may be scrambled relative to the order shown. Also, two or more numbers shown in succession in FIGS. 7-8 may be performed concurrently or with partial concurrence. Further, in some embodiments, one or more of the numbers shown in FIGS. 7-8 may be skipped or omitted. In addition, any number of elements might be added to the logical flow described herein, for purposes of enhanced utility, accounting, performance measurement, or providing troubleshooting aids, etc. It is understood that all such variations are within the scope of the present disclosure.

The components described herein may be implemented by circuitry. In this regard, such circuitry may be arranged to perform the various functionality described above by generating and/or responding to electrical or other types of signals. The circuitry may be general purpose hardware or hardware that is dedicated to performing particular functions. The circuitry may include, but is not limited to, discrete components, integrated circuits, or any combination of discrete components and integrated circuits. Such integrated circuits may include, but are not limited to, one or more microprocessors, system-on-chips, application-specific integrated circuits, digital signal processors, microcomputers, central processing units, programmable logic devices, state machines, and/or any combination thereof. As used herein, the circuitry may also include interconnects, such as lines, wires, traces, metallization layers, or any other element through which components may be coupled. Additionally, the circuitry may be configured to execute software to implement the functionality described herein.

It is emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. An apparatus, comprising:
a first input stage configured to generate a first signal responsive to a first differential input signal;
a second input stage configured to generate a second signal responsive to a second differential input signal;
a first output stage configured to generate a first differential output signal responsive to the first signal generated by the first input stage;
a second output stage configured to generate a second differential output signal responsive to the second signal generated by the second input stage; and
a common-mode voltage sense configured to decouple a common-mode component of the first and second differential output signals.

2. The apparatus of claim 1, further comprising:
a capacitor coupled to the common-mode voltage sense, the first input stage, and the first output stage.

3. The apparatus of claim 1, further comprising:
a capacitor coupled to the second input stage, the second output stage, and the common-mode voltage sense.

4. The apparatus of claim 1, further comprising:
a first capacitor coupled to a first output of the common-mode voltage sense, an output of the first input stage, and an input of the first output stage; and
a second capacitor coupled to the first output of the common-mode voltage sense, an output of the second input stage, and an input of the second output stage.

5. An apparatus, further comprising:
an input stage configured to generate a signal responsive to a differential input signal;
an output stage configured to generate a differential output signal responsive to the signal generated by the input stage;
a first common mode voltage sense coupled to the output stage and configured to decouple a common-mode component of the differential output signal; and
a second common-mode voltage sense coupled to the input stage and configured to decouple a common-mode component of the differential input signal.

6. An apparatus, comprising:
an input stage configured to generate a signal responsive to a differential input signal;
an output stage configured to generate a differential output signal responsive to the signal generated by the input stage;
a common mode voltage sense configured to decouple a common-mode component of the differential output signal; and
a current source configured to generate a bias current for the input stage responsive to an output current generated by the output stage.

7. An apparatus, comprising:
an input stage configured to generate a signal responsive to a differential input signal;
an output stage configured to generate a differential output signal responsive to the signal generated by the input stage; and
a common mode voltage sense configured to decouple a common-mode component of the differential output signal, wherein
the input stage further comprises a first transconductance stage and a second transconductance stage, the first transconductance stage configured to generate at least a portion of the signal responsive to the differential output signal and the differential input signal, the second transconductance stage configured to generate at least a portion of the signal responsive to the common-mode component of the differential output signal.

8. The apparatus of claim 1, further comprising:
a current source configured to generate a bias for the first input stage responsive to an output current generated by at least one of the first and second output stages.

9. The apparatus of claim 1, further comprising:
a current source configured to generate a bias for the second input stage responsive to an output current generated by at least one of the first and second output stages.

10. The apparatus of claim 1, wherein
the first input stage generates the first signal based on the first differential input signal and the first differential output signal received from an output of the first output stage.

11. The apparatus of claim 1, wherein
the second input stage generates the second signal based on the second differential input signal and the second differential output signal received from an output of the second output stage.

12. The apparatus of claim 1, wherein
the first input stage comprises a first transconductance stage and a second transconductance stage.

13. The apparatus of claim 12, wherein
the first transconductance stage is configured to generate at least a portion of the first signal responsive to the first differential output signal and the first differential input signal, and
the second transconductance stage is configured to generate at least a portion of the first signal responsive to the common-mode component of the first differential output signal.

14. The apparatus of claim 1, wherein
the second input stage comprises a first transconductance stage and a second transconductance stage.

15. The apparatus of claim 12, wherein
the first transconductance stage is configured to generate at least a portion of the second signal responsive to the second differential output signal and the second differential input signal, and
the second transconductance stage is configured to generate at least a portion of the second signal responsive to the common-mode component of the second differential output signal.

16. The apparatus of claim 1, further comprising:
a second common-mode voltage sense configured to decouple a common-mode component of the first and second differential output signals.

17. The apparatus of claim 5, further comprising
a second input stage configured to generate a second signal responsive to a second differential input signal.

18. The apparatus of claim 17, further comprising
a second output stage configured to generate a second differential output signal responsive to the second signal generated by the second input stage.

19. The apparatus of claim 5, further comprising:
a capacitor coupled to the first common-mode voltage sense, the input stage, and the output stage.

20. The apparatus of claim 19, wherein
the capacitor is coupled to a first output of the first common-mode voltage sense, an output of the input stage, and an input of the output stage.

* * * * *